TRANSISTOR SWITCHING CIRCUIT

Filed Nov. 23, 1960 2 Sheets-Sheet 1

INVENTORS
ELDON W. HAWKINS
ARNOLDS JANSONS
BY
H. H. Losche
ATTORNEYS

Feb. 25, 1964 E. W. HAWKINS ETAL 3,122,651

TRANSISTOR SWITCHING CIRCUIT

Filed Nov. 23, 1960 2 Sheets-Sheet 2

INVENTORS.
ELDON W. HAWKINS
ARNOLDS JANSONS
BY
H. H. Losche
ATT'YS.

United States Patent Office 3,122,651
Patented Feb. 25, 1964

3,122,651

TRANSISTOR SWITCHING CIRCUIT

Eldon W. Hawkins and Arnolds Jansons, Indianapolis, Ind., assignors to the United States of America as represented by the Secretary of the Navy Filed Nov. 23, 1960, Ser. No. 71,369
5 Claims. (Cl. 307—88.5)
(Granted under Title 35, U.S. Code (1952), sec. 266)

The invention described herein may be manufactured and used by or for the Government of the United States of America for governmental purposes without the payment of any royalties thereon or therefor.

This invention relates to switching circuits and more particularly to semiconductor switching circuits which will function correctly if the base control voltage for the "on" condition is supplied for less than a complete cycle of signal input voltage and in which a novel bias network reversely biases the semiconductor to prevent semiconductor conduction during the "off" condition of the semiconductor switch.

In the normal switching circuits, and particularly for semiconductors or transistors, both polarities of base control voltage are applied for the duration of the entire input cycle and the semiconductor or transistor will be forward biased during the "on" condition and reversed biased in the "off" condition for both base-emitter and base-collector junctions; however, in the pulsed mode of operation, when the base control voltage is absent for part of the cycle, it is possible for the signal voltage to forward bias the base-collector or base-emitter junction allowing the semiconductor or transistor to conduct. Such conduction periods are a disadvantage in switching circuits since unwanted conduction periods in the switching cycle exist.

In the present invention a network utilizing a Zener diode and a capacitor coupled in parallel are included in the base circuit of a switching transistor to reverse bias the base-emitter and base-collector junctions during the absence of the base control voltage pulse. The Zener diode is oriented to oppose the control voltage during the "on" condition of the transistor switch and to direct the current to the capacitor charging it up to the breakdown voltage of the Zener diode. This capacitor voltage will be applied to the base of the semiconductor or transistor whenever the control voltage is cut off or reversed. The emitter-collector junction of the semiconductor or transistor may be coupled to an alternating current signal voltage source and by synchronizing and phasing the base control voltage to the signal voltage any part of it can be used to charge an output capacitor in the output circuitry. The alternating current signal voltage source applied to the emitter-collector junction may also be used in a nonsynchronous relation with the control voltage to produce vairous direct current voltage patterns in the output of the circuit. The output of the circuit is taken from opposite plates of the output capacitor in the signal circuit. In lieu of an alternating current signal voltage source applied to the emitter-collector junction, a low frequency or varying direct current voltage, or a fixed voltage source such as a battery, may be utilized and the output capacitor will then be charged to approximately the amplitude of the direct current voltage source. It is therefore a general object of this invention to provide a semiconductor or transistor switching circuit capable of switching only for predetermined or preselected voltage portions of a varying or alternating current voltage signal to the "on" condition as determined by the control voltage and with a base drive network capable of preventing forward biasing of the base-emitter or base-collector junctions in the absence of the control voltage during the "off" condition.

The above general object and other objects, advantages, features, and uses will become more apparent to those skilled in the art as the description proceeds when considered along with the accompanying drawing, in which.

Figure 1:
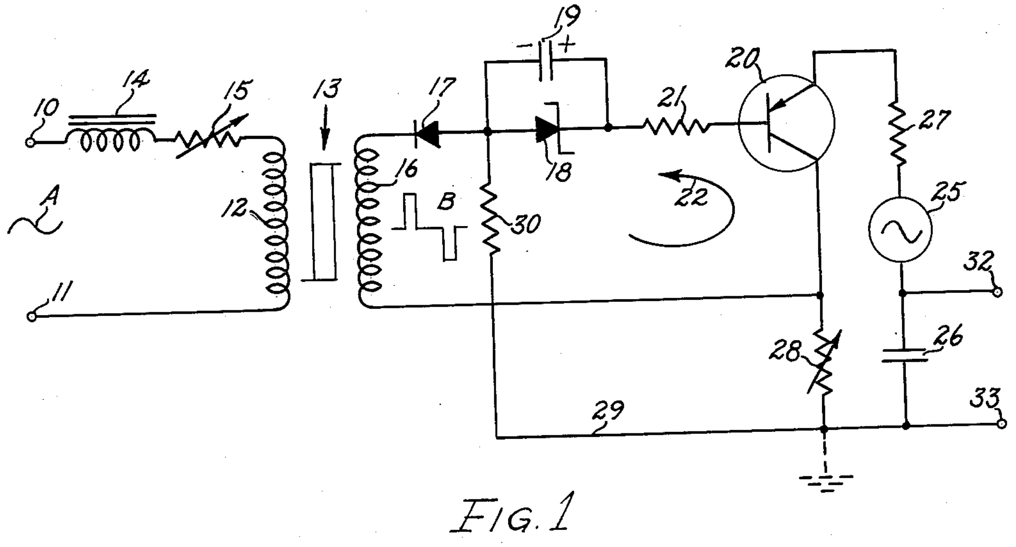
FIGURE 1 illustrates in circuit schematic diagram one preferred form of this invention.

Referring more particularly to FIGURE 1, an input voltage may be applied to the terminals 10 and 11 across the primary winding 12 of a square loop or magnetic amplifier type core of transformer 13. In the primary circuit from terminal 10 is an inductance 14 and a variable resistance 15 for adjusting the phase relation of a control voltage in the secondary circuit. The inductance 14 acts to limit the current and the variable resistance 15, in combination with the inductance 14, provides a phase shifter. The input voltage is preferably and more suitably an alternating current producing a sine wave such as that illustrated by a curve A.

The secondary 16 of the square loop core transformer 13 has one lead coupled to the collector of a transistor 20 and the other lead coupled through a diode 17, a parallel circuit of a Zener diode 18 and a capacitor 19, and a resistance 21 in series to the base of transistor 20. The diode 17 and Zener diode 18 are oriented in a back-to-back relation which would allow flow of current out of the bottom of the secondary winding 16 through the collector and base junction into the top of the secondary winding 16 whenever the control voltage produced in the secondary 16 exceeds the breakdown voltage of the Zener dide 18. This flow of current is illustrated by the curve and arrow 22 within the loop. The sine wave input voltage A, applied through the primary winding 12, produces the control voltage represented by a curve B on the secondary 16 which control voltage could be produced by pulse generating circuits, if desired. Control voltage B is shown in the ideal or desired shape in the secondary of the transformer herein. In normal practice control voltage B would not precisely form rectangular positive and negative pulses as shown, but such an ideal curve is sufficient in describing this invention.

The emitter-collector signal circuit is established from an applied alternating current signal voltage source 25, one terminal of which is applied to the emitter of transistor 20 and the other terminal of which is applied to one plate of an output capacitor 26. Resistance 27, in the coupling between the alternating current signal voltage source 25 and the emitter of transistor 20, is representative of the signal source internal impedance. The collector of transistor 20 is coupled through a variable resistance 28 to the other or opposite plate of the output capacitor 26. The juncture of the variable resistance 28 and the output capacitor 26 is coupled by way of a conductor means 29 through a high impedance resistance 30 to the back-to-back juncture of diode 17 and Zener diode 18. The output of the emitter-collector circuit is taken from terminals 32 and 33 across the output capacitor 26. The variable resistance 28 is adjustable to compensate for the offset voltage or threshold voltage of the transistor 20 as will be more fully explained in the statement of operation. FIGURE 1 shows the invention applied in a transistor circuit where the transistor is operated in the inverted circuit relationship. It is to be understood that the transistor 20 may be used in its normal circuit relation as shown by later figures although this circuit is illustrated to set out by comparison with later figures that lower transistor leakage currents, $I_{co}$, and lower offset voltages are accomplished by this inverted transistor circuit relationship.

Figure 2:
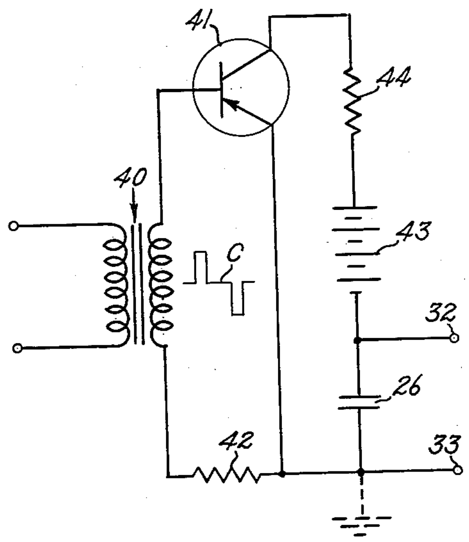
FIGURE 2 illustrates an old and well-known form of switching circuit not incorporating this invention for circuit comparison.

Referring more particularly to FIGURE 2, an input transformer 40 may be used to receive positive and negative pulsed control voltages, the secondary of which applies the pulsed control voltages, represented by the curve C, to the base and emitter of a transistor 41. A current limiting resistor, as 42, is normally used in the base-emitter circuit. An emitter-collector signal voltage 43 is applied in the same manner as the alternating current signal voltage 25 in FIGURE 1, this direct current signal source internal resistance being illustrated by the resistance 44. In this emitter-collector signal circuit the positive terminal of the battery 43 is coupled to the collector, the negative terminal is coupled to one plate of the output capacitor 26, and the other plate of the output capacitor is coupled directly to the emitter of transistor 41. Output terminals 32 and 33 are again taken across the output capacitor 26. As may be seen in this conventional type circuit the base-emitter or base-collector junctions may be forward biased during the portions when control voltage C is zero. Reference will be made to this figure during the statement of operation of FIGURES 1 and 3.

Figure 3:
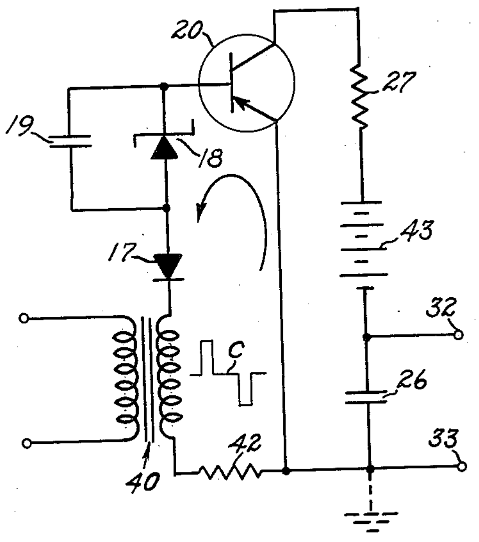
FIGURE 3 illustrates a modification of the invention shown in FIGURE 1.

Referring more particularly to FIGURE 3, wherein like reference characters represent like parts as illustrated in FIGURE 1, the primary difference in this circuit from that of FIGURE 1 is the use of the battery 43 as the emitter-collector signal source in place of an alternating current signal source as illustrated in FIGURE 1. It is also illustrated that a transformer, such as 40 used in FIGURE 2 to conduct pulsed control voltages illustrated by the curve C, is equally applicable to the circuit of FIGURE 3 incorporating the network 17, 18, and 19 to back bias the base-emitter and base-collector junctions of transistor 20 during the "off" condition of the semi-conductor switch. The network 28, 30 of FIGURE 1 could be added to the circuit of FIGURE 3, where desired or necessary to the operation thereof.

In the operation of the device of FIGURE 1, in illustrating the transistor switching circuit incorporating the invention, let it be assumed that an alternating current input voltage, such as represented by the waveform A, is applied to the primary winding of the square loop core transformer 13 producing pulsed control voltage waveform B in the secondary thereof. All upward swings of the control voltage waveform B will be blocked by the diode 17 which substantially establishes an open circuit for every tendency of current to flow clockwise in the loop through the base and collector of transistor 20 and the secondary 16.

Downward extending control voltage pulses will be bypassed through the capacitor 19 until the capacitor is charged to the amplitude of the Zener voltage. Thereafter, current produced by the control voltage will be conducted through the Zener diode 18 providing the "on" condition of the transistor switch 20. During the "off" condition when no control voltage is applied the capacitor 19 will retain its charge to back-bias the transistor 20 to cut off all conduction thereof at which time no current will flow from the alternating signal voltage source 25 to the capacitor 26. If the control voltage B is synchronized with the alternating current signal voltage 25 and phase adjusted to 90° or 270°, the capacitor 26 will be charged to substantially the peak voltage of the alternating current signal source 25 for each control voltage pulse B switched by the switching transistor 20. If a high impedance element is connected to the output terminals 32 and 33, the voltage produced on the plates of the output capacitor 26 will be substantially a constant direct current, the degree of discharge of the output capacitor 26 producing a direct current wave pattern depending on the degree of impedance across the output terminals 32 and 33. Whenever it is desirable to displace the phase relation of the control voltage B with respect to the alternating current signal source 25, the phase adjustment will be made at the variable resistance 15 to change the phase of the control voltage B and quadrature rejection may be accomplished by this means. When other direct current waves, shapes, or patterns may be desired on the output 32, 33, the control voltage B and the alternating current signal source 25 may be preselected out of synchronism to establish these patterns; that is, for example, the switching transistor 20 may be made to switch on any multiple positive or negative voltage swings from the alternator 25. As may be seen from this description, the switching transistor 20 will be back biased by the capacitor 19 voltage to completely cut off base-emitter, base-collector, and emitter-collector currents in the absence of the depending pulse of control voltage B. As illustrated in the ordinary and normal circuit of FIGURE 2 the base of transistor 41 will actually be forward biased by the signal source 43 during the absence of control voltage C and will allow collector current to flow to the output capacitor 26.

In the operation of FIGURE 3, when a control voltage C is applied through transformer 40, the positive swing of control voltage C will be ineffective since it is blocked by the diode 17. The negative swing of control voltage C will be bypassed through capacitor 19 until the capacitor 19 is charged to the amplitude of the Zener voltage, at which time current produced by the negative swing of control voltage C will be conducted through the Zener diode 18, which is also applied to the base of transistor 20 to switch this transistor to the conductive state. The conductive state of transistor 20 places the battery 43 across the terminals of the capacitor 26 thereby charging it to substantially the potential of the battery source 43. It is to be understood that the battery source potential 43 must be less than the Zener voltage and the control signal voltage C must be greater than the Zener voltage for proper switching operation. When the negative swing of the control voltage C ends, the capacitor 19 will retain its charge at substantially the amplitude of the Zener voltage of the Zener diode 18. The voltage at the terminal of the elements 17, 18, and 19 will rise to ground potential by virtue of the return in control voltage C to ground potential producing a positive voltage on the base of transistor 20 by virtue of the charge stored on capacitor 19 back-biasing this transistor to its "off" condition.

Purely for the purpose of example, let it be assumed that the battery voltage 43 is 10 volts, the Zener voltage of Zener diode 18 is 15 volts, and the control signal voltage amplitude of the control voltage C is 20 volts peak. As hereinbefore stated, the +20 volt swing of control voltage C is ineffective in the switch. When the −20 volt swing of control voltage C is applied, a current will start to flow in the circuit out of the bottom of transformer 40, through resistor 42, through the emitter-base junction of transistor 20, first through capacitor 19, and through diode 17 to the top of transformer 40. This is possible because the emitter-base junction and diode 17 are forward biased by the negative control voltage C. The current is limited by resistor 42. This flow of current will charge capacitor 19 to the Zener voltage of Zener diode 18. This establishes voltage on the base of transistor 20 of approximately −.7 volt with respect to the emitter which is at ground potential during the time that control voltage C is in the negative swing considering that a voltage drop of about 3.6 volts occurs across resistor 42. Since transistor 20 is turned "on" by virtue of the current flow in the forward direction through the emitter-base junction, the transistor 20 is capable of conducting current in either direction through the emitter and collector. The battery 43 is now coupled across capacitor 26 through resistance 27 and transistor 20, the resistance 27 limiting the emitter-collector current. Capacitor 26 will be charged substantially to the voltage amplitude of battery 43 which produces a −10 volts on terminal 32 and zero volts on the collector of transistor 20. When the control voltage C returns to zero, the current stops flowing in the forward direction from emitter to base of transistor 20 because the source C disappears. Now the only voltage source is the voltage across the capacitor 19 which will try to force current in the reverse direction through the base-emitter junction of transistor 20 and diode 17. The capacitor 19 voltage will now be divided between the base-emitter junction of transistor 20 and the diode 17 in accordance with their reverse resistance ratio. The back-bias voltage on the base-emitter junction of transistor 20 is almost equal to the voltage across capacitor 19 by virtue of selecting a low back-resistance diode 17 (or by shunting the diode 17 with a resistor as illustrated by resistor 30 in FIGURE 1). The voltage on the base of transistor 20 is approximately +15 volts which retains the transistor 20 in cutoff condition. Since the battery 43 voltage is 10 volts maximum in this example, the collector voltage can never exceed the base voltage of transistor 20 and therefore transistor 20 is maintained in a cutoff state until the next negative swing of control voltage C appears. The only time that the collector could approach +10 volts would be if capacitor 26 were completely discharged in the interval between negative swings of control voltage C. Capacitors 19 and 26 are chosen of sufficiently high capacity to retain their respective charges during the intervals between the negative swings of control voltage C. While other voltages and Zener voltage may be used, the relationship of the voltages must be adhered to for proper switching operation. In the embodiment of FIGURE 3 the transistor 20 is in its normal or upright position of base-emitter control demonstrating that the switching transistor 20 may be used either in an upright or inverted condition in carrying out the invention. The inverted transistor condition shown in FIGURE 1 provides for less leakage current, $I_{co}$, and lower offset voltage of the transistor than the circuit arrangement of FIGURE 3.

Figure 4:
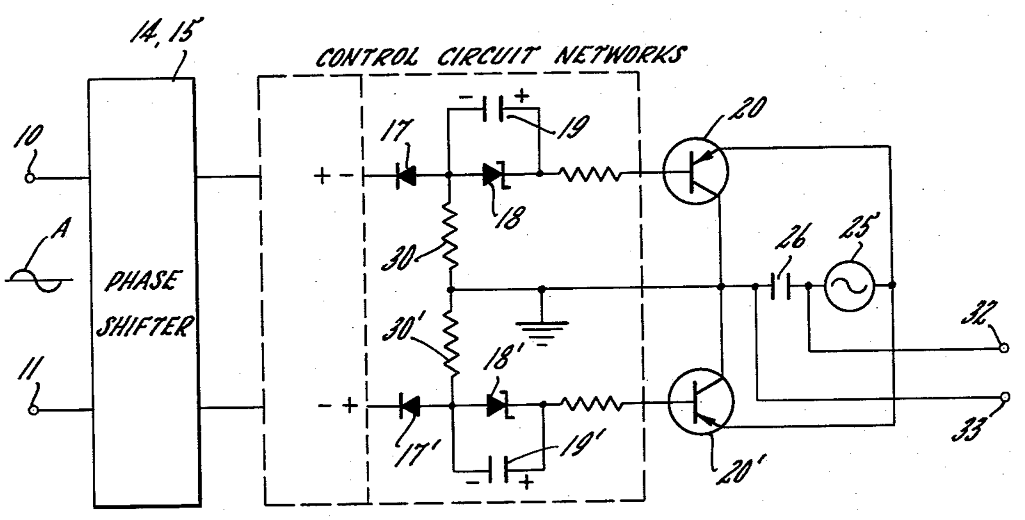
FIGURE 4 illustrates a partially block and partially circuit schematic diagram of a full wave switching circuit.

FIGURE 4 illustrates the circuit of FIGURE 1 doubled to provide a full wave switch demodulator for converting an alternating current signal into a direct current output. Like reference characters represent like parts with those in FIGURE 1, the duplicate parts having the reference characters primed (').

It is also to be understood that while P-N-P type transistors are illustrated in the embodiments shown and described herein, it is to be understood that N-P-N type transistors may likewise be used in their normal or in their inverted circuit conditions in like manner as P-N-P type transistors. Fixed potential or grounding points are shown in dotted lines in the figures although such grounding points are not essential to the full and complete understanding of the invention. These grounds are merely representative of points which could be placed at fixed potential although in some applications other ground points may be more desirable.

While many modifications and changes may be made in the constructional details and features of this invention without departing from the spirit and teaching of this invention, it is understood that we desire to be limited only by the scope of the appended claims.

We claim:

1. A transistor switching circuit comprising: a transistor having base, emitter, and collector electrodes; a signal voltage applied across said emitter and collector electrodes in circuit, said circuit including an output capacitor across which an output voltage is produced; a pulse generating means for receiving input voltages on an input thereof, an output of said pulse generating means being coupled in a control circuit across the base and one of the other electrodes, said control circuit having a diode and a Zener diode in back-to-back serial relation in series with a resistance in said control circuit, and said Zener diode having a capacitor coupled in parallel therewith to charge to the potential established by the breakdown voltage of said Zener diode to produce a base electrode cutoff bias, said resistance establishing the conduction bias of said transistor whereby the transistor is biased to cutoff during the absence of control voltage and to conduction of said transistor in the presence of a control voltage.

2. A transistor switching circuit as set forth in claim 1 wherein said pulse generating means is a square loop core transformer in which the input is the primary thereof and the output is the secondary thereof.

3. A transistor switching circuit as set forth in claim 2 wherein said voltage applied across said emitter and collector electrodes in circuit is an alternating current signal voltage, said voltage applied to the primary is through a variable resistance and choke to said square loop core transformer and is an alternating current voltage, and said two above-mentioned alternating current voltages are synchronized in desired phase relation by said variable resistance.

4. A transistor switching circuit as set forth in claim 3 wherein said emitter-collector signal circuit includes a variable resistance coupling said secondary control circuit through a high impedance to the common junction of the back-to-back coupling of said diode and Zener diode to variably compensate for the offset voltage of said transistor to prevent an output voltage appearing in the absence of signal voltage.

5. A transistor switching circuit comprising: at least a pair of transistors each having base, emitter, and collector electrodes; a signal voltage applied across said emitter and collector electrodes in circuit across an output capacitor across which an output voltage is produced; an input circuit to the base electrodes of said transistors through control circuit networks for accepting positive and negative pulses, said input circuit including a phase shifting device and said control circuit networks including a diode and a Zener diode in back-to-back serial relation in series with a resistance for each transistor base electrode, the juncture of said diode and Zener diode being baised through a resistance to a fixed potential and said Zener diode having a capacitor coupled in parallel therewith to charge to the potential established by the breakdown voltage of said Zener diode to produce a base electrode cutoff bias in a positive direction for one of the transistors and in a negative direction for the other of the transistors, said resistance establishing the conduction bias of said transistors whereby alternating current and direct current voltage patterns can be produced on said output in accordance with the selected alternating current and direct current signal voltages applied and the adjusted phase shift of said input voltage pulses.

References Cited in the file of this patent

UNITED STATES PATENTS

| | | |
|---|---|---|
| 2,866,909 | Trousdale | Dec. 30, 1958 |
| 2,948,473 | Schaefer | Aug. 9, 1960 |
| 2,954,483 | Ulrich | Sept. 27, 1960 |
| 2,964,653 | Cagle et al. | Dec. 13, 1960 |
| 3,015,737 | Harris et al. | Jan. 2, 1962 |
| 3,021,431 | Wellman | Feb. 13, 1962 |